United States Patent
Houge et al.

(10) Patent No.: US 6,714,892 B2
(45) Date of Patent: Mar. 30, 2004

(54) THREE DIMENSIONAL RECONSTRUCTION METROLOGY

(75) Inventors: Erik Cho Houge, Orlando, FL (US); John Martin McIntosh, Orlando, FL (US); Larry E. Plew, St. Cloud, FL (US)

(73) Assignee: Agere Systems, Inc., Allentown, PA (US)

(*) Notice: Subject to any disclaimer, the term of this patent is extended or adjusted under 35 U.S.C. 154(b) by 0 days.

(21) Appl. No.: 09/967,119

(22) Filed: Sep. 28, 2001

(65) Prior Publication Data

US 2002/0156594 A1 Oct. 24, 2002

Related U.S. Application Data

(60) Provisional application No. 60/275,193, filed on Mar. 12, 2001.

(51) Int. Cl.[7] ............................................. G06F 15/00
(52) U.S. Cl. ........................................ 702/155; 702/166
(58) Field of Search ..................... 356/2, 73, 237.2, 356/600, 601, 625, 630; 438/14; 700/56, 67, 89, 95, 98, 110, 121, 303; 702/155, 167; 250/310, 311; 73/105

(56) References Cited

U.S. PATENT DOCUMENTS

| | | | | |
|---|---|---|---|---|
| 3,842,272 A | * | 10/1974 | Coates et al. | 250/311 |
| 4,584,646 A | * | 4/1986 | Chan et al. | 364/449 |
| 4,732,473 A | * | 3/1988 | Bille et al. | 356/237 |
| 5,963,314 A | * | 10/1999 | Worster et al. | 356/237.2 |
| 6,157,032 A | * | 12/2000 | Into | 250/310 |
| 6,250,143 B1 | * | 6/2001 | Bindell et al. | 73/105 |
| 6,267,005 B1 | * | 7/2001 | Samsavar et al. | 73/105 |

FOREIGN PATENT DOCUMENTS

| | | | | |
|---|---|---|---|---|
| JP | 63-218804 | * | 12/1988 | G01B/15/00 |
| JP | 2000-146558 | * | 5/2000 | G01B/15/24 |
| JP | 2000-199705 | * | 7/2000 | G01B/11/24 |

OTHER PUBLICATIONS

Goldstein, et al.; "Scanning Electron Microscopy and X-Ray Microanalysis";ISBN 0–306–44175–6; pp154–157.*

(List continued on next page.)

Primary Examiner—John Barlow
Assistant Examiner—Douglas N Washburn
(74) Attorney, Agent, or Firm—David G. Maire; Beusse Brownlee Wolter Mora & Maire, P.A.

(57) ABSTRACT

A system and method of metrology (10) whereby a three dimensional shape profile is defined (16) for a surface feature on a substrate by applying (38) a transform function $F(x)$ to an image intensity map $I(x,y)$ obtained (40) by inspecting the substrate with a scanning electron microscope (12). The transform function $F(x)$ is developed (34) by correlating the image intensity map of a first wafer (18) to a height vector (32) obtained by inspecting the first wafer with a more accurate metrology tool, for example a stylus nanoprofilometer (14). A simple ratio-based transform may be used to develop $F(x)$. An asymmetric multiple parameter characterization of the three dimensional shape profile may be developed (74) by plotting critical space and width dimensions ($S_L$, $S_R$, $W_1$, $W_R$) from a vertical axis (C—C) as a function of height of the feature.

20 Claims, 9 Drawing Sheets

OTHER PUBLICATIONS

Nakajima, K; Kosaka, N; Tomoda, T; Sakaue, Y; Tsutsumi, R; "Development Of A 3D Measuring System For Semiconductor Patterned Wafers"; Industrial Electronics Society; 16th Annual Conference; Nov. 1990, vol. 1; pp 497–500.*

Lee; United States Statutory Invention Registration H1530; May 1996.*

Masafumi, T; Tomofumi, F; Youichi, K;"Scanning Tunneling Microscopy of Cleaved Si and GaAs Surfaces in Air"; Japanese Journal Of Applied Physics; Part 2; Vol 28 Issue 2; Feb. 1988; pp L290–292.*

Moto, O; Watanabe, K;"Ellipsometric Characterization of Semiconductor Surface Layers"; Semiconductor Technologies; 1984; pp 359–371.*

Hayes, T; Bowley, R; Littau, M; Raymond, C;"Accuracy and Precision of Scatterometer Measurements Relative to Conventional CD Metrology"; Digest of the LEOS Summer Topical Meetings. Optical Sensing in Semiconductor Manufacturing; pp 39–40.*

* cited by examiner

THREE DIMENSIONAL RECONSTRUCTION METROLOGY

This application claims benefit of the Mar. 12, 2001, filing date of U.S. provisional patent application No. 60/275, 193.

BACKGROUND OF THE INVENTION

The present invention relates generally to the field of metrology and more particularly to the measurement of very small features on the surface of a microelectronics substrate.

Quality control for the production of microelectronic devices, such as integrated circuit features formed on semiconductor substrate wafers, often depends upon the accurate measurement of the dimensions of various features formed over the substrate surface. Accurate measurement of the topography of the surface of the substrate facilitates not only a pass/fail inspection routine, but also provides a basis for feedback control of upstream processes and feed forward control of downstream processes.

The desire for precise measurement of the surface topography of a microelectronics device must be tempered by the cost and time involved in obtaining such information. At one extreme, destructive examination of a semi-conductor wafer may reveal precise dimensional information at the expense of a useable wafer and many hours of delay time.

The size of semiconductor devices continues to decrease and the metrology used to measure such devices must respond accordingly. There are many types of both optical and electron based metrology tools available, such as scanning electron microscope (SEM), focused ion beam microscope, focused x-ray microscope and focused optical microscopes including near-field scanning optical microscopy. As the size of devices has decreased, optical imaging metrology for critical dimensions has been abandoned. The scanning electron microscope currently plays a major role for metrology in the semiconductor manufacturing industry. Modem 157 nm lithography technology pushes the limits of top down critical dimension scanning electron microscopes (CDSEM). The technology critical dimension nodes of 120 nm and 100 nm lithography will require more precision and accuracy than the SEM appears to be able to provide while utilizing current technologies.

The critical dimension scanning electron microscope utilizes algorithms based upon the intensity of line scan profiles of images to extract the apparent width of features. While the CDSEM offers quick and repeatable measurements of the intensity profiles of features, it remains difficult to establish the exact morphology of the feature from a top down plan view perspective. This is, in part, due to the extensive electron beam interactions within the specimen. That is, the CDSEM will measure the intensity of the secondary electron signal from pixel to pixel across the sample surface. If a particular feature is flat, e.g. the top of a feature or the bottom of a trench, then the secondary electron signal will be constant as long as the surface material remains constant. When the interaction volume that intersects with the surface area of the material changes, the intensity of the secondary electrons that escape from the surface will also change. This topographic effect results in edge effects that blur the image at locations of morphology change. This blurring produces an uncertainty in the critical dimension measurement. While the shape of the intensity profiles respond to drastic changes in morphology, more subtle changes may be lost within the intensity profiles. When intensity profiles are averaged down a plurality of scan lines, additional feature information may be lost.

A CDSEM is used to develop a top down image as shown in FIGS. 1A and 1B. These images represent an intensity of secondary electrons across the plane of the substrate surface $I(x, y)$. FIG. 1A is an SEM image for a semiconductor wafer I-line metal photoresist having a normal morphology, and FIG. 1B is an SEM image for a similar photoresist having an abnormal morphology. An amplitude modulated waveform $P(x)$ may be constructed as a function of this topographic information by averaging $I(x, y)$ over N number of lines using Equation 1:

$$P(x) = \frac{\sum_{y=1}^{N} I(x, y)}{N} \quad (1)$$

FIGS. 2A and 2B illustrate the function $P(x)$ as an amplitude modulated waveform representing the average intensity developed from the normal and abnormal photoresist lines of FIGS. 1A and 1B respectively. Known algorithms may be applied to these waveforms to identify critical dimensions, such as the width of the line at 50% wall height, as identified by dashed lines in FIGS. 2A and 2B. Many processes in the semiconductor industry have relied upon this single parameter characterization of the SEM data. Note, however, that single parameter characterization of the data may fail to discern a difference between normal and abnormal morphologies, for example, when both structures have the same critical dimension of 0.684 um as illustrated in FIGS. 2A and 2B.

Multiple parameter characterization (MPC) refers to the use of functions or groups of measurements where a singular discrete measurement can no longer effectively represent the data. MPC is being developed in many different forms for application to scanning electron microscope data in an attempt to address the shortcomings of single parameter characterization, as described above. The shape and scale of the amplitude modulated waveform $P(x)$ can be described through multiple parameters. FIG. 3 illustrates an amplitude modulated waveform $P(x)$ divided into two portions. The distance between the left and right regions of the waveform in solid lines defines a width measurement W and the distance between the left and right regions of the waveform in dashed lines defines a line space measurement S. At discrete intervals along the height of these regions a measurement may be taken for the width and line space, then plotted as a function of height, as shown in FIG. 4. Curve $W_N$-$S_N$ represents the MPC of the normal morphology of FIGS. 1A and 2A. Curve $W_A$-$S_A$ represents the MPC of the abnormal morphology of FIGS. 1B and 2B. Here the difference between the normal and abnormal morphologies is readily apparent. Other derived MPC values may be used to illustrate deviations from normal profiles, such as roughness measured as the 3-sigma value of the difference between the maximum and minimum critical dimension values along a line profile. Roughness may be useful for illustrating the abnormal photoresist profile known as scumming, where the resist removal fails to clear the resist between developed photoresist lines.

A database of MPC curves such as shown in FIG. 4 may be established for a particular device/process. Preset process margin templates may be established to define acceptable ranges for the MPC values for the evaluation of subsequently manufactured devices. While this quality control procedure is much improved when compared to single parameter evaluation of inspection data, it suffers from the shortcomings of any database driven system. Such shortcomings include a heavy reliance on numeric processing and a resultant lack of speed and a lack of flexibility that requires the establishment of an entirely new database each time a change is made to the process/device.

Another technique for nondestructively examining microelectronics devices is scanning probe microscopy (SPM). SPM includes various techniques of metrology wherein a probe tip is used to study the surface topography or properties of the surface of a substrate. One such device is the atomic force microscope (AFM). Another such device is the stylus nanoprofilometer (SNP) which has emerged recently as a potential tool for critical dimension metrology for both masks and 157 nm integrated circuit technology. An SNP probe tip makes contact with the substrate with only a small force at only discrete pixel points, thus minimizing the probe wear problems associated with atomic force microscopy, where a probe tip continuously touches, or nearly touches, the surface between points. The SNP probe tip is then retracted from the surface a distance sufficient to clear vertical features, moved horizontally a preset distance, and then moved back toward the surface. The vertical resolution is currently 0.3 nm or less. The distance between pixels determines the scan resolution, which currently may be as small as 1.0 nm. The scan time will be the product of time per pixel and the number of pixels. It is possible to obtain precise and accurate three dimensional topographical information with a stylus nanoprofilometer by collecting multiple adjacent line scans. However, a major disadvantage of the SNP is a lack of speed in collecting topographic information.

Scatterometers are currently being proposed for use in the semiconductor industry to provide high speed two dimensional topographic information. These devices are able to determine a cross-section but are unable to determine how that cross-section varies as a function of distance down a line. While such devices provide the promise of improved metrology for small microelectronics devices, they represent a radical change in the equipment base for the semiconductor manufacturing industry. There is some question whether the benefits achievable with modem scatterometers will justify the capital investment necessary to achieve such benefits.

Thus, three technologies are emerging for in-line metrology for semiconductor manufacturing applications. CDSEM is able to provide 3-dimensional information of x-y verses electron intensity, but electron intensity does not correlate easily to feature height. SPM-based tools are able to provide 3-dimensional information of x-y verses height, but they do so at very slow speeds. Scatterometers are able to provide 2-dimensional information of x or y verses height, but they are unable to determine localized information as the values are statistically determined over a large area.

BRIEF SUMMARY OF THE INVENTION

There is a particular need for an improved metrology system that may be used to provide three dimensional (x-y verses height) topographical information with an accuracy sufficient for current and next generation microelectronics devices, with the ability to provide localized information and with a throughput speed sufficient to support in-line feedback and feed forward quality control systems.

A method of metrology is disclosed herein as including: characterizing a surface of a first substrate with an intensity matrix $I_1(x, y)$ to produce a function $P_1(x)$ of $I_1(x, y)$ representative of a first area of the surface of the first substrate; obtaining a height vector $H_1(x)$ representing the surface topography of the first area of the surface of the first substrate; defining a transform function $F(x)$ operable to convert the function $P_1(x)$ to the height vector $H_1(x)$; characterizing the surface of a second substrate with a second intensity matrix $I_2(x, y)$; and applying the transform function $F(x)$ to the second intensity matrix $I_2(x, y)$ to develop topography information for a feature along the surface of the second substrate.

In one embodiment, the step of producing a function $P_1(x)$ includes calculating $P_1(x)$ as a weighted average intensity over the first area of the surface of the first substrate across a plurality of scan lines according to the equation.

$$P(x) = \frac{\sum_{l=1}^{N} I(x, l) * \left[ \sum_{m=1}^{N} \left( \frac{1}{1 + \frac{|I(x, l) - I(x, m)|}{A}} \right)^3 \right]^3}{\sum_{l=1}^{N} \left[ \sum_{m=1}^{N} \left( \frac{1}{1 + \frac{|I(x, l) - I(x, m)|}{A}} \right)^3 \right]^3}$$

where $P(x)$ is a reduced amplitude modulated waveform, $I(x)$ is the intensity matrix, N is the number of lines used to calculate the localized waveform, and A is one-half of the total range of the data set. In a further embodiment, the step of defining a transform function $F(x)$ includes computing a ratio between the function $P_1(x)$ and the height vector $H_1(x)$. The method may further include: obtaining the intensity matrix $I_1(x, y)$ by scanning the surface of the first substrate with a scanning electron microscope to produce a top down image containing topographical information represented by the intensity matrix $I_1(x, y)$; and obtaining the height vector $H_1(x)$ by using one of a scanning probe microscope, a stylus nanoprofilometer and a scatterometer.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 5:
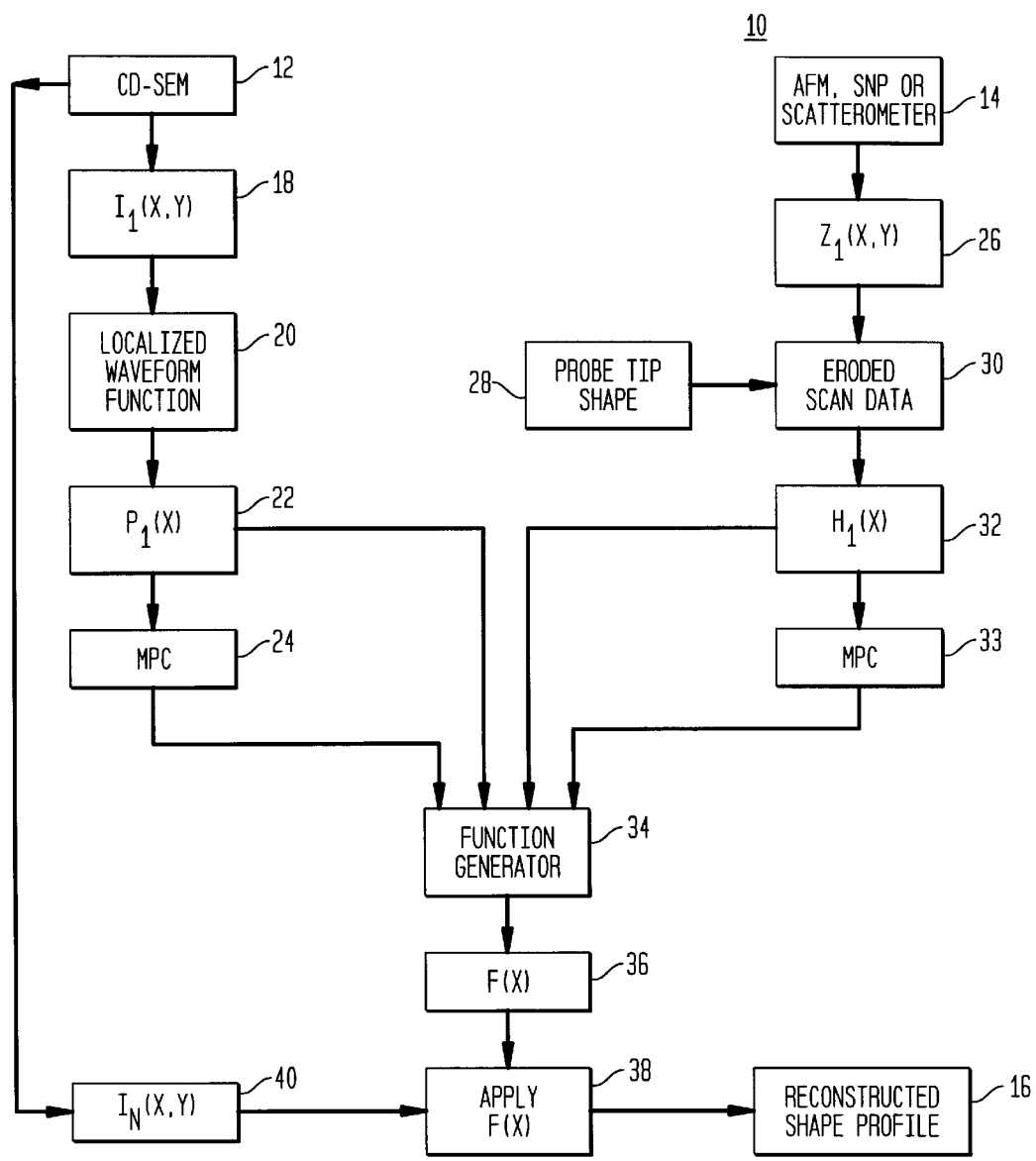
FIG. 5 illustrates an improved system for measuring the topography of the surface of a microelectronics substrate.

An improved system 10 for measuring the topography of the surface of a microelectronics substrate is schematically illustrated in FIG. 5. System 10 utilizes both a critical dimension scanning electron microscope (CDSEM) 12 and a stylus nanoprofilometer 14 to reconstruct a surface feature shape profile 16. The system 10 exhibits improved functionality for feedback and feed forward control when compared to the prior art single parameter and multiple parameter metrology systems.

The CDSEM 12 is used to scan the surface of a first substrate to produce a top down, i.e. plan view, image containing topographical information 18 represented by an intensity matrix $I_1(x, y)$, where x and y are axes normal to each other and parallel to the plane of the surface of the substrate. One may appreciate that an intensity matrix may be produced with other devices and the intensity may be based upon other planes of view, but in the present semiconductor manufacturing industry, the CDSEM is part of an installed equipment base upon which this invention may be built.

The topographic information contained in the intensity matrix 18 is processed through a localized waveform function 20 to obtain an amplitude modulated waveform 22 from a localized range, for example as described above with respect to Equation 1. Such traditional construction of the amplitude modulated waveform is an arithmetic mean over a large number of pixels. This creates ambiguities and has the effect of averaging out the detail held within the intensity matrix information. Alternatively, a correlation-based weighted arithmetic function that provides a reduced amplitude modulated waveform over a small number of pixel lines may be used, such as the function of Equation 2.

$$P(x) = \frac{\sum_{l=1}^{N} I(x,l) * \left[\frac{\sum_{m=1}^{N} \left(\frac{1}{1 + \frac{|I(x,l) - I(x,m)|}{A}}\right)^3}{N}\right]^3}{\sum_{l=1}^{N} \left[\frac{\sum_{m=1}^{N} \left(\frac{1}{1 + \frac{|I(x,l) - I(x,m)|}{A}}\right)^3}{N}\right]} \quad (2)$$

P(x) is the reduced amplitude modulated waveform, I(x) is the intensity matrix, N is the number of lines used to calculate the localized waveform, and A is one-half of the total range of the data set (e.g. for an 8 bit pixel (0 to 255) or 2 to the eight power, the value of A would be 128). This equation was determined empirically. The exponential values can be modified to control the weighting of the function and a bounding criterion may also be used to eliminate outliers within the weighting portion of the function. Equation 2 is defined by way of example only. Other forms/functions may be equally suitable for other applications.

Figure 1A:
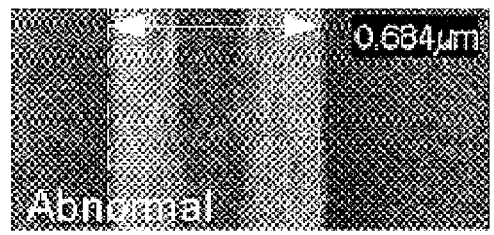
FIG. 1A is a scanning electron microscope top down image of a semiconductor wafer having an I-line metal photoresist with a normal morphology.
Figure 1B:
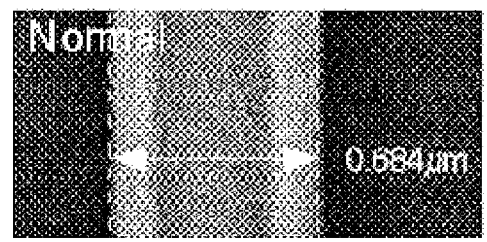
FIG. 1B is a prior art scanning electron microscope top down image of a semiconductor wafer having an I-line metal photoresist with an abnormal morphology.
Figure 2A:
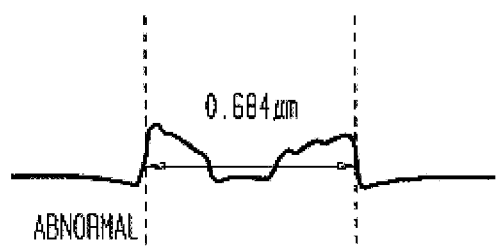
FIG. 2A is a prior art amplitude modulated waveform P(x) developed from the data of FIG. 1A.
Figure 2B:
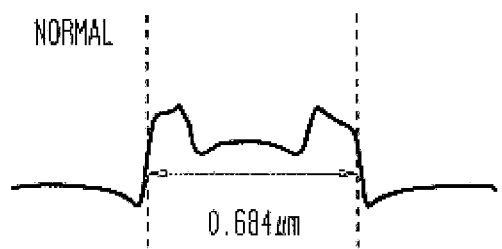
FIG. 2B is a prior art amplitude modulated waveform P(x) developed from the data of FIG. 1B.
Figure 3:
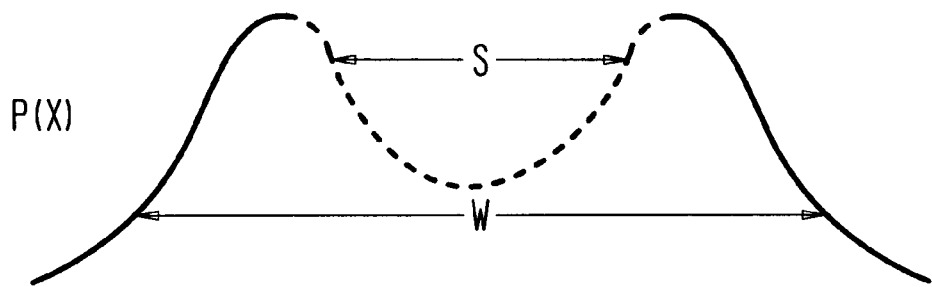
FIG. 3 is a prior art amplitude modulated waveform P(x) divided into two portions illustrating a width measurement W and a line space measurement S.
Figure 4:
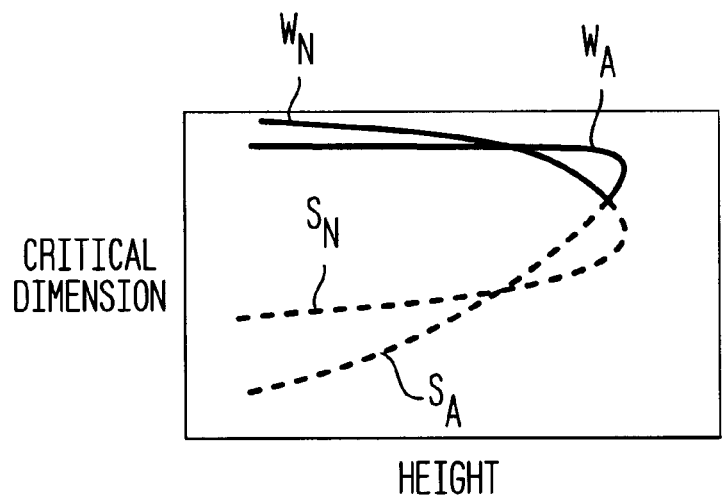
FIG. 4 is a prior art multiple parameter characterization of the data of FIGS. 2A and 2B illustrating the difference between normal and abnormal photoresist line morphologies.
Figure 9A:
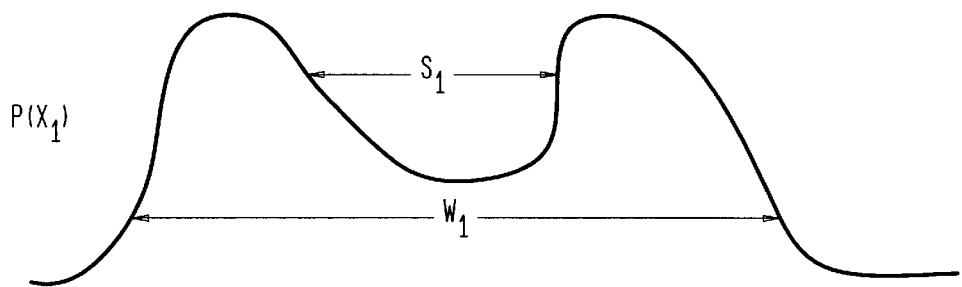
FIGS. 9A and 9B illustrate two different amplitude modulated waveforms having the same prior art MPC space and width characteristics.
Figure 9B:
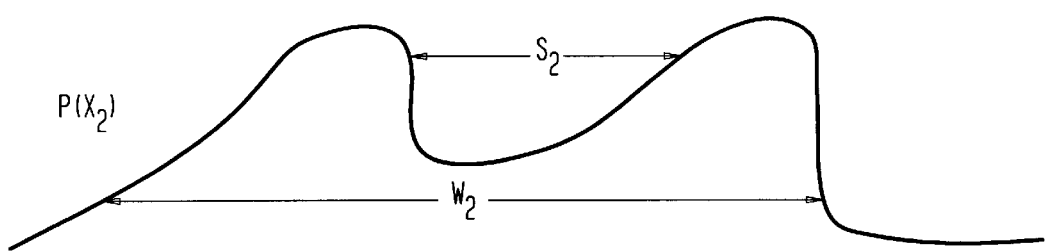
Figure 10:
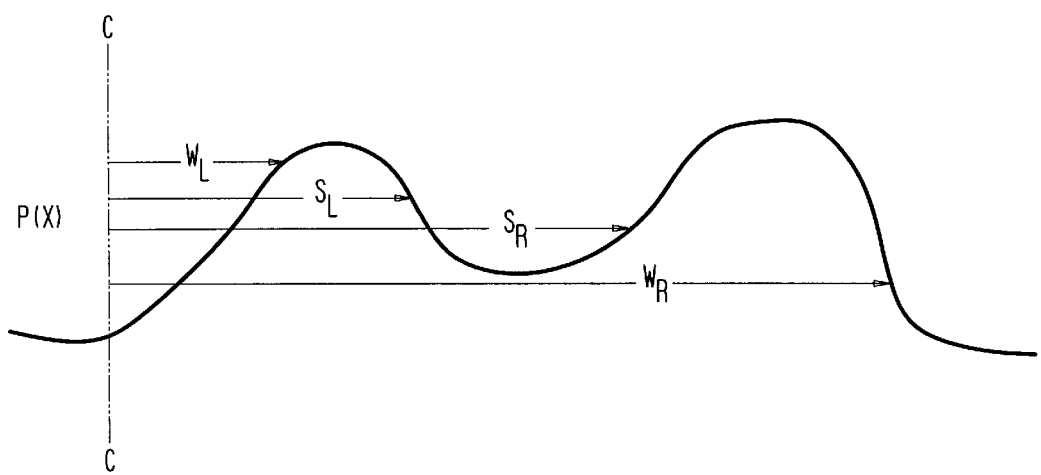
FIG. 10 illustrates an amplitude modulated waveform wherein a plurality of width and space dimensions are defined as dimensions from a central axis.
Figure 11:
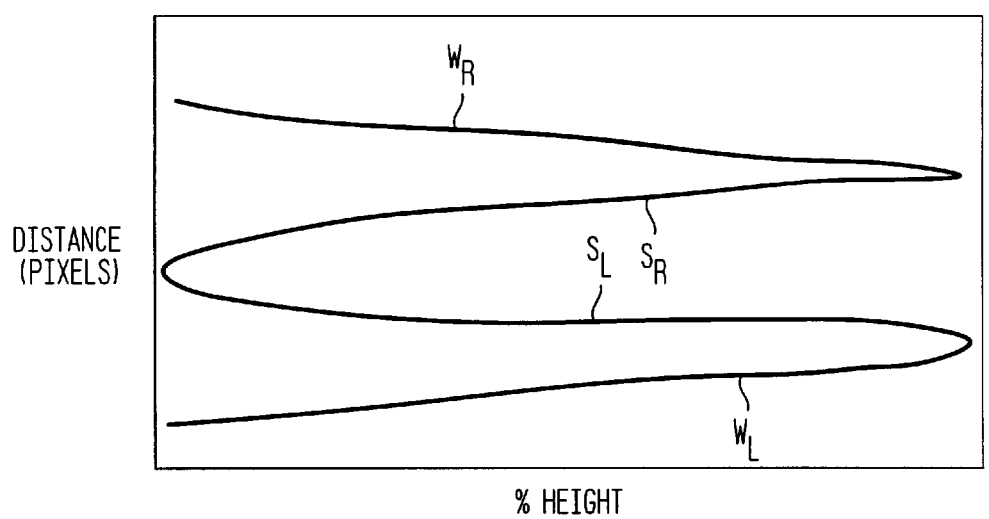
FIG. 11 is an MPC curve developed from the width and space dimensions of FIG. 10.

One or more multiple parameter characterizations 24 may be used to describe the information contained in the amplitude modulated waveform 22. Examples of such multiple parameter characterizations are described above with respect to FIG. 4. This type of prior art multiple parameter characterization describes the variation in space and width of the amplitude modulated waveform, but it is incapable of characterizing asymmetries in that waveform. A new type of MPC curve utilizes a deviation from a defined central (vertical) axis in the localized waveform function instead of the deviation of the width and space information. This is useful for all shapes/topographical features that are not identical with respect to their central (vertical) axis. The prior art MPCs of FIG. 4 will lose information for features which differ on either side of a central axis. For example, the two waveforms $P(X_1)$ and $P(X_2)$ of FIGS. 9A and 9B, respectively, have significant differences, yet may have the same space ($S_1$ and $S_2$) and width ($W_1$ and $W_2$) characteristics. An improved multiple parameter characterization of these such a waveform is developed by defining space and width dimensions from a defined axis such as axis C, as shown in FIG. 10. Four dimensions from axis C may be defined as the left width $W_L$, the left space $S_L$, the right space $S_R$, and the right width $W_R$. A two-humped MPC curve may be plotted for each of these dimensions, as shown in FIG. 11. FIG. 11 represents a new asymmetric MPC which maintains all the sidewall information separated from the left and right sidewalls with respect to the central axis. This asymmetric MPC is required to reconstruct function generators that are able to compensate for left-right sidewall differences and for functional dependence of the location of secondary electron detectors and asymmetries within lens components within the CDSEM that was used to generate the intensity data.

The first substrate is also examined with the stylus nanoprofilometer 14 to produce a topographic map 26 of the substrate surface. The probe tip shape 28 is known from the results of scans over characterizers having known shapes. The probe tip shape 28 is used at step 30 to evaluate topographic map $Z_1(x, y)$ to develop a height vector H(x) at step 32. One may appreciate that height vector $H_1(x)$ represents two dimensional topographical information. Other techniques may be used to obtain the height matrix $H_1(x)$. For example, the height vector information may be obtained by elipsometry or a scatterometer may be used. Further, a multiple parameter characterization 33 of the height vector may be developed.

A transform function generator is used at step 34 to define a transform function F(x) 36 useful to transform the CDSEM information to the height vector $H_1(x)$. The MPC 24 of the amplitude modulated waveform or the amplitude modulated waveform itself 22 may be used as input to the function generator 34. Similarly, the MPC 33 of the height information or the height vector 33 itself may be used as input. The transform function F(x) 36 may subsequently be applied at step 38 to reconstruct the sample surface from the amplitude modulated waveforms 40 of the additional substrates numbered 2 through N that may later be processed through the CDSEM 12. The resultant reconstructed shape profile 16 will differentiate normal and abnormal morphologies and may be used for both dimensional verification and process control purposes. By combining the speed and precision of the scanning electron microscope with a highly accurate measuring tool, such as the SPM, SNP, scatterometer, elipsometry device or even destructive examination, one obtains a system that is capable of supporting the metrology needs of the next generation of semiconductor processes without having to make a large capital expenditure to replace the exiting SEM infrastructure. This combined technology system uses the SEM to obtain localized information corresponding to a surface feature, then uses a function generator to provide a transform function developed from the more accurate (e.g. SNP) data to position the localized information on the feature.

It is possible at step 34 to construct many different transforms F(x) between the intensity profile MPC and the height vector 32. The simplest is a ratio based transform of MPC H(x) 33 to MPC P(x) 24. While this transform has limited range for the purposes of inline metrology, that range is sufficient for the purpose of microelectronics device characterization. Even if the reconstruction of grossly out of shape features is incorrect, the methodology will identify the shape change and will flag the profile as resulting from a deviant morphology. A scanning probe microscope, such as SNP 14, may then be used for subsequent imaging of poorly shaped features for more detailed analysis. Normally, at the resist level, the exact morphology of extremely deviant shapes is not needed. Functional based transforms or neural net based transforms may be used rather than a correlation based transform. The transform function generator may be embodied as hardware and/or software, as is known in the art. For example, a personal computer having programmed instructions for calculating the above described ratio may be used.

Figure 6:
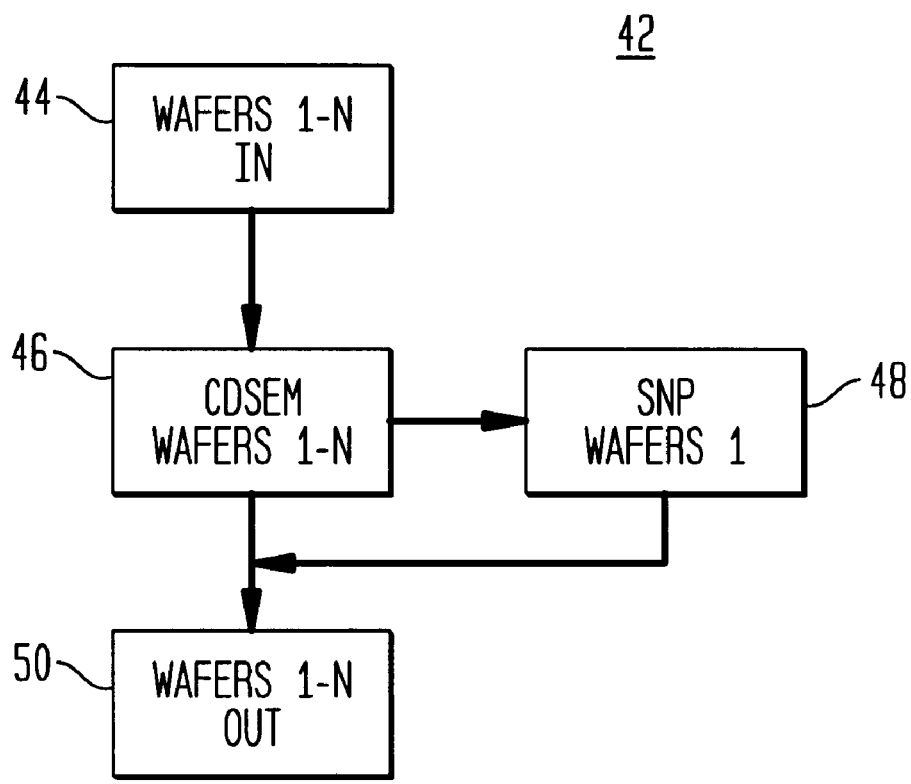
FIG. 6 is a flow chart illustrating the flow of semiconductor wafers in the metrology system of FIG. 5.

FIG. 6 illustrates the metrology process flow 42 of semiconductor wafers in a clean room manufacturing environment utilizing the system 10 of FIG. 5. A plurality of N semiconductor wafers is received at step 44. All N of the wafers are inspected with a top down CDSEM at step 46. One of the wafers is also subjected to inspection with a stylus nanoprofilometer at step 48. Alternatively, other types of inspections may be used at step 48 to obtain information representing the topography of the surface of the wafer using a technique having an accuracy grater than the accuracy provided by the top down scanning electron microscope. Such other techniques may include destructive examination, atomic force microscopy, etc. The wafers are all processed out at step 50 with a reconstructed shape profile being developed for each of the wafers 2-N based upon a transform function defined by the CDSEM and SNP information from the first wafer.

Figure 7:
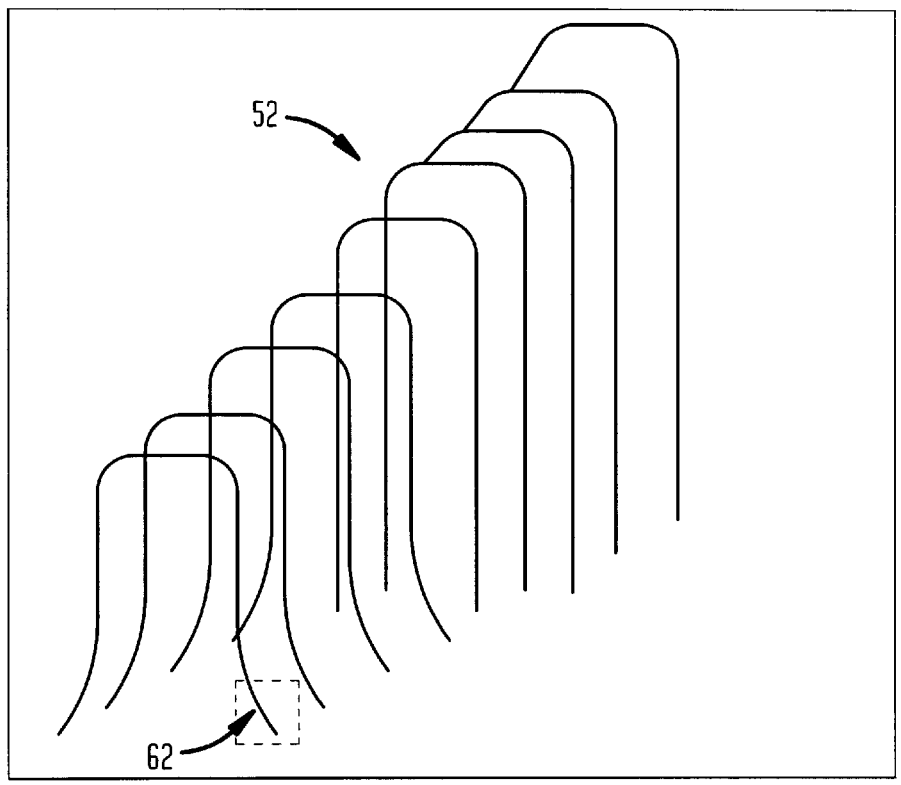
FIG. 7 is a virtual three dimensional feature profile reconstructed from a height vector and a CDSEM intensity map.
Figure 8:
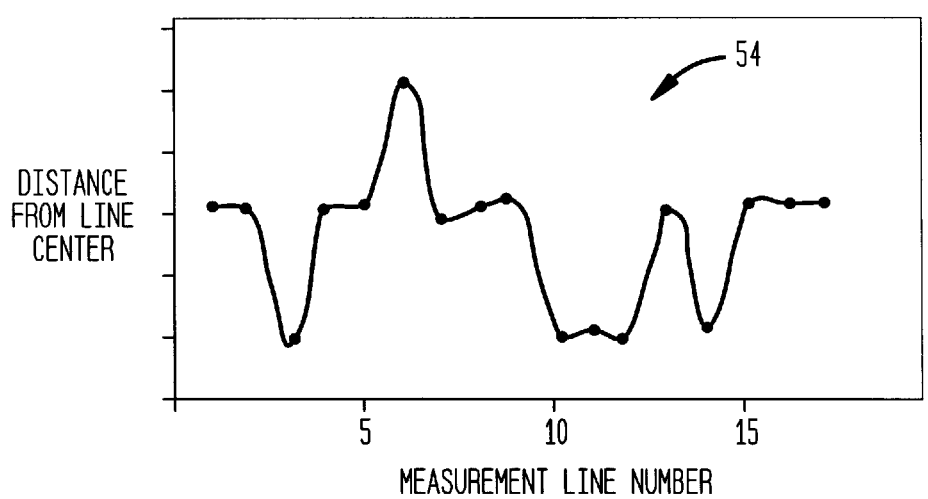
FIG. 8 illustrates a line edge roughness curve developed from the left hand side wall of FIG. 7.
Figure 12:
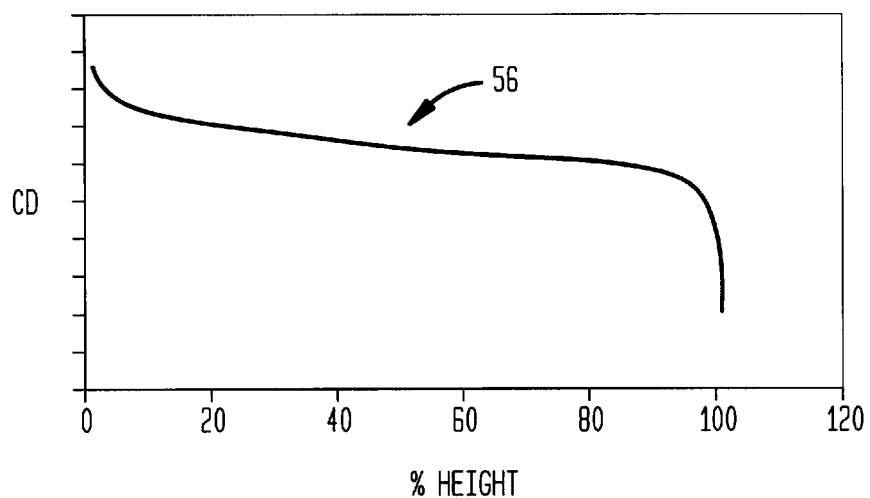
FIG. 12 is a multiple parameter characterization of the virtual profile of FIG. 7 showing critical dimension versus percent height of the feature.
Figure 13:
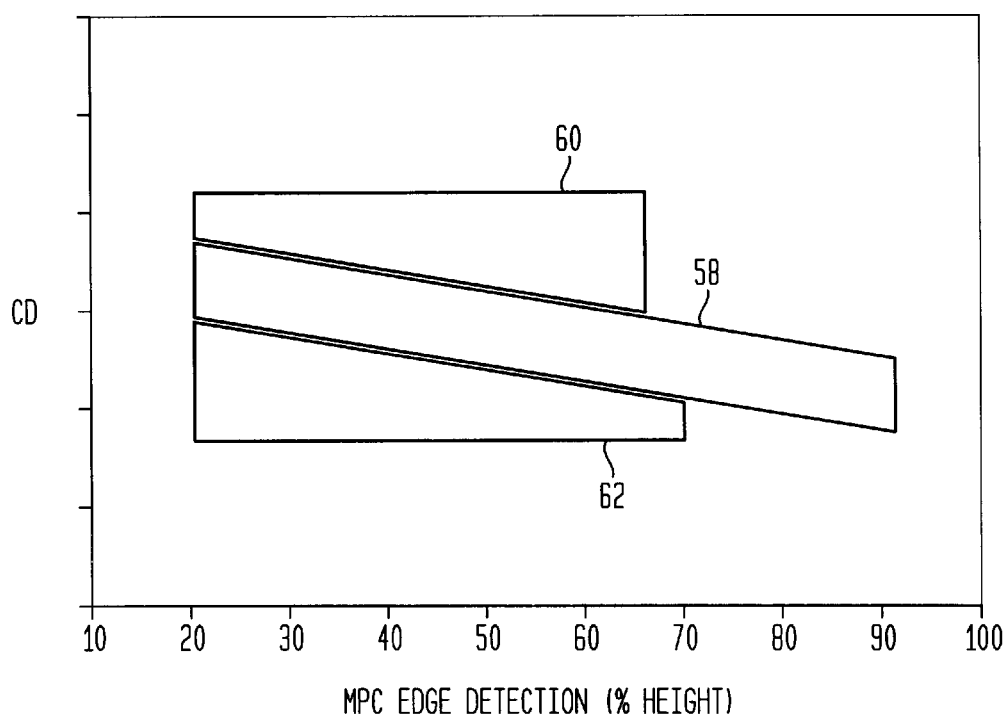
FIG. 13 illustrates acceptance and deviation bins for the MPC data of FIG. 12.

The shape of a substrate feature may thus be represented as either a cross sectional or three dimensional representation of the intensity waveform to create a virtual cross section. FIG. 7 illustrates one example of a three dimensional reconstructed (TDR) profile 52 of a metal line on a semiconductor wafer that has been reconstructed from a height vector H(x) and a CDSEM intensity map I(x, y). Any variety of metrology data may be generated from these three dimensional reconstruction values. For example, FIG. 8 illustrates a line edge roughness curve 54 of the left hand side wall of FIG. 7 at 50% of wall height. FIG. 12 illustrates how scale of the feature may be represented by a multiple parameter characterization rather than a single parameter characterization. Scale information may be represented by a graph of critical dimension versus percent height of the feature, by critical dimension versus height of the feature, by critical dimension from a central axis versus percent height of the feature, or by critical dimension from the central axis versus height of the feature, as examples. FIG. 12 illustrates a plot 56 of critical dimension versus percent height of the feature. A plurality of such curves may be developed for a plurality of different cross-sections of the virtual feature of FIG. 7. Furthermore, a methodology for templating these new statistical process control monitors may be constructed, as shown in FIG. 13. A first window or bin 58 of acceptable values may be defined. Any plot 56 of metrology data falling outside of the acceptance bin 58 would indicate a failed part or process. A deviation bin 60 may be defined as a predefined range of values in a particular area of the reconstructed profile falling outside of the bin 58 of acceptable values, such as the footing area 62 illustrated in FIG. 7. The size and shape of the acceptance bin 58 may be dependent upon the criticality of the dimension to device performance. Other deviation bins 62 may be defined to trigger specific process parameter changes, such as a change in an upstream process parameter to bring a drifting process back into a preferred range, or a change in a downstream process parameter that is selected to counteract a specific shape deviation. For example, a predetermined deviation bin may correspond to a known photolithography mask feature shape deviation for which a downstream compensation can be made by increasing the oxygen flow rate during a subsequent etching process. Alternatively, a deviation bin may be identified to trigger an upstream change in a lithography focus or exposure parameter.

It is also possible to vary the size and shape of the acceptance bin 58 or any deviation bin 60,62 based upon a learning process. In one embodiment, one or more neural networks may be trained for feedback/feed forward control of a semiconductor manufacturing process from post-etch feature shapes and sizes. One such learning process control network is described in co-pending, commonly owned U.S. patent application Serial Number (NOT YET ASSIGNED), filed on the same day as the present invention (attorney docket Houge 25-24-17, inventors Houge, Mcintosh and Reitman), the disclosure of which is incorporated by reference herein.

Figure 14:
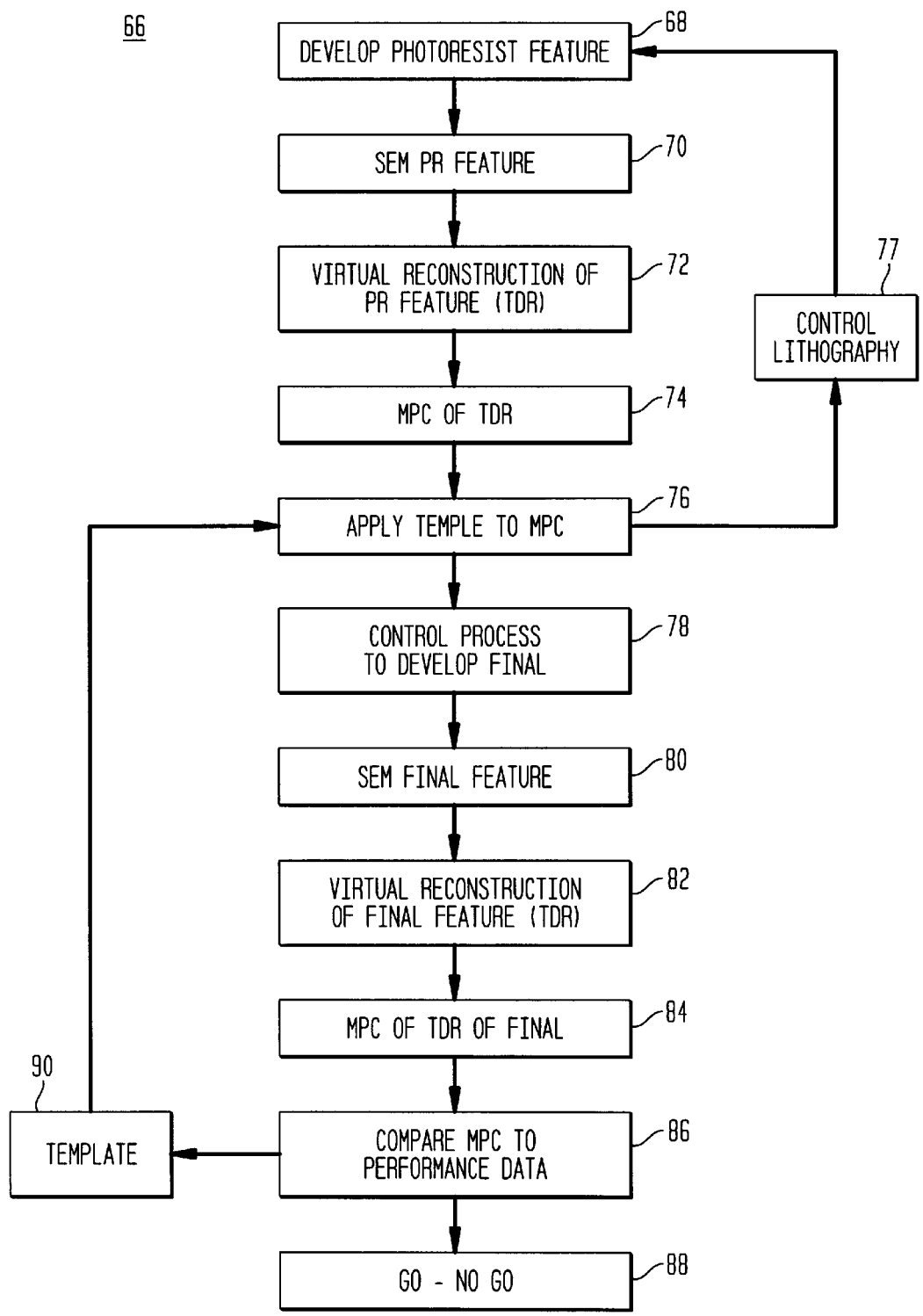
FIG. 14 is a flow diagram for a semiconductor manufacturing process wherein multiple parameter characterizations of three dimensional reconstructed feature shapes are used for both the control of a downstream etch process and for training a learning process to refine a quality control template.

The process and system described above provides a more accurate metrology than prior art processes and systems by averaging out the errors inherent in the SEM tool while developing a "virtual" physical shape. SEM data is very precise, but the data is not repeatable over time, i.e. not accurate, due to operational variability, machine location, etc. SEM data from different batches or different machines can not be compared due to this lack of accuracy. The present process and system removes the variability of SEM data between the photoresist and a resulting metal line through the use of three dimensional reconstructed shapes. By using SEM data to create a virtual physical shape, the accuracy is increased. This increased accuracy may be used to accommodate a greater variation in the photoresist geometry by adjusting a downstream process parameter, thereby effectively widening process control windows and allowing a greater process variability while facilitating improved control of the overall manufacturing process. FIG. 14 illustrates a semiconductor manufacturing process and system 66 incorporating these ideas. A photoresist feature is developed on a semiconductor wafer at step 68. A scanning electron microscope is used at step 70 to obtain intensity information of the photoresist feature, and a virtual reconstruction of the photoresist feature is developed at step 72 by applying a transform function as described above with respect to FIG. 5. An MPC of the reconstructed feature 74 is applied to a template 76 to define an etching process control parameter for developing a final feature 78 on the wafer surface. This step may further be used to identify the need for adjusting an upstream lithography control parameter 77 in order to account for a drifting process or to effect any other desired change. The final feature is scanned with an SEM device 80 and a virtual reconstruction of the final feature is developed at step 82. A multiple parameter characterization of the virtual final feature developed at step 84 may be compared to performance data 86 for developing a go/no-go gate 88, and may further be used to develop/refine the template 90 used in step 76 for controlling the etching process. The performance data may be historical data and/or it may be performance data for the individual wafer. Thus the system 66 enables the development of feed-forward and feedback controls based on SEM inspection data by removing the inaccuracies normally associated with such data. Accordingly, the installed industry-wide SEM equipment inventory may be used to support the production of the next generation of microelectronics devices with improved yields resulting from in-line process control.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

We claim as our invention:

1. A method of characterizing a feature positioned along a plane comprising:
   providing first intensity matrix information $I_1(x,y)$ representative of a first feature;
   obtaining height vector information $H(x)$ separate from the first intensity matrix information representing a portion of the first feature topography relative to the plane;
   applying the height vector information to the first intensity matrix information to create a transform function $F(x)$ operable to define additional topographic information.

2. The method of claim 1 including applying the transform function $F(x)$ to define additional topographic information along the first feature.

3. The method of claim 1 including characterizing a second feature with second intensity information $I_2(x,y)$ and applying the transform function $F(x)$ to the second intensity matrix information to define topographic information along the second feature.

4. The method of claim 1 including forming the first feature along a plane of a semiconductor wafer.

5. The method of claim 3 including forming the first feature along a plane of a semiconductor wafer and forming the second feature along a plane of a second semiconductor wafer.

6. The method of claim 2 wherein applying the transform function $F(x)$ to define additional topographic information along the first feature provides information sufficient to describe the first feature in three dimensions.

7. The method of claim 3 wherein applying the transform function $F(x)$ to the second intensity matrix information to define topographic information along the second feature provides information sufficient to describe the second feature in three dimensions.

8. The method of claim 1 wherein the first intensity matrix information is obtained from multiple scans of a scanning electron microscope and information from multiple sequential scans is combined to provide a reduced set of information with improved signal to noise ratio.

9. The method of claim 8 wherein the information from multiple sequential scans is combined to provide a weighted average intensity by using the equation:

$$P(x) = \frac{\sum_{l=1}^{N} I(x,l) * \left[ \sum_{m=1}^{N} \left( \frac{1}{1 + \frac{|I(x,l) - I(x,m)|}{A}} \right)^3 \right]^3}{\sum_{l=1}^{N} \left[ \sum_{m=1}^{N} \left( \frac{1}{1 + \frac{|I(x,l) - I(x,m)|}{A}} \right)^3 \right]^3}$$

where $I(x)$ is the first intensity matrix information, N is the number of scan lines used to calculate the localized waveform, and A is one-half of the total range of the data set.

10. The method of claim 1, wherein the height vector information is obtained with a scanning probe microscope.

11. The method of claim 1, wherein the height vector information is obtained with a stylus nanoprofilometer.

12. The method of claim 1, wherein the height vector information is obtained with a scatterometer.

13. The method of claim 1, wherein the height vector information is obtained by elipsometry.

14. A method of characterizing comprising:
   obtaining a first data set of localized information corresponding to a first feature on a first surface;
   using height information related to the first feature to develop a transform function that positions the first data set of localized information relative to the first surface; and
   applying the transform function to a second data set of localized information corresponding to a second feature along a second surface to develop topographic information related to the second feature.

15. A method of characterizing a feature positioned along a plane comprising:
   providing a first image representative of a first feature surface based on multiple scan lines of data, each scan line comprising an ordered array of data values, the first image containing topographical information represented by an intensity matrix $I(x,y)$;
   producing a weighted average among corresponding values in different arrays for multiple scan lines of data representative of a first area along the feature surface to produce a weighted average array of data;
   obtaining height vector information $H_1(x)$ separate from the first image representing a portion of the first feature surface relative to a plane;
   applying the height vector information to the weighted average array of data to create a transform function $F(x)$ operable to define additional topographic information.

16. The method of claim 15 wherein the weighted average is computed according to the equation:

$$P(x) = \frac{\sum_{l=1}^{N} I(x,l) * \left[ \frac{\sum_{m=1}^{N} \left( \frac{1}{1 + \frac{|I(x,l) - I(x,m)|}{A}} \right)^3}{N} \right]^3}{\sum_{l=1}^{N} \left[ \frac{\sum_{m=1}^{N} \left( \frac{1}{1 + \frac{|I(x,l) - I(x,m)|}{A}} \right)^3}{N} \right]^3}$$

where P(x) is the reduced amplitude modulated waveform, I(x) is the intensity matrix, N is the number of lines used to calculate the localized waveform, and A is one-half of the total range of the data set.

17. A method of characterizing comprising:
scanning a feature on a surface of a substrate to produce a top down image containing topographical information represented by an intensity matrix $I_1(x,y)$;
producing a function P(x) representative of a first area of the surface of substrate as a function of $I_1(x,y)$; and
developing a multiple parameter characterization MPC P(x) of the function P(x) by:
defining a reference axis in relation to the function P(x); and
measuring space and width dimensions of the function P(x) from the reference axis as a function of height of the feature.

18. A method comprising:
obtaining a first data set of information $I_1(x,y)$ related to a surface feature of a first semiconductor wafer using one of a scanning electron microscope, a focused ion beam microscope, a focused x-ray microscope and a focused optical microscope;
obtaining a second data set of information $H_1(x)$ related to the surface feature of the first semiconductor wafer with one of the group of an atomic force microscope, a scanning probe microscope, an ellipsometer, a stylus nanoprofilometer, a scatterometer, and a destructive test;
developing a transform function F(x) which correlates the first data set of information $I_1(x,y)$ to the second data set of information $H_1(x)$;
obtaining a third data set of information $I_N(x,y)$ related to a surface feature of a second semiconductor wafer using the one of a scanning electron microscope, a focused ion beam microscope, a focused x-ray microscope and a focused optical microscope; and
applying the transform function F(x) to the third data set of information $I_N(x,y)$ to develop data representing a three dimensional shape corresponding to the surface feature of the second semiconductor wafer.

19. An apparatus for characterizing a surface of a specimen, the apparatus comprising:
a means for nondestructively examining a surface of a specimen and for producing topographic information represented by an intensity matrix I(x,y) across the surface of the specimen;
a waveform generator adapted for producing a function P(x) representing a localized area of the surface of the specimen as a function of I(x,y);
a means for nondestructively examining the surface of the specimen and for producing topographic information represented by a height vector H(x); and
a function generator having the function P(x) and the height vector H(x) as inputs and operable to produce a transform function F(x) for transforming P(x) to H(x).

20. A system for characterizing a surface of a specimen, the system comprising:
a scanning electron microscope device adapted for nondestructively examining a surface of a specimen and for producing topographic information represented by an intensity matrix I(x,y) across the surface of the specimen;
a waveform generator adapted for producing a function P(x) representing a localized area of the surface of the specimen as a function of I(x,y);
one of a scatterometer and a scanning probe microscope adapted for nondestructively examining the surface of the specimen and for producing topographic information represented by a height vector H(x); and
a function generator having the function P(x) and the height vector H(x) as inputs and operable to produce a transform function F(x) for transforming P(x) to H(x).

* * * * *